(12) United States Patent
Portico Ambrosio et al.

(10) Patent No.: US 7,944,011 B2
(45) Date of Patent: May 17, 2011

(54) OPTICALLY CONTROLLED ELECTRICAL-SWITCH DEVICE BASED UPON CARBON NANOTUBES AND ELECTRICAL-SWITCH SYSTEM USING THE SWITCH DEVICE

(75) Inventors: Michele Portico Ambrosio, Poggiomarino (IT); Maria Grazia Maglione, Torre Del Greco (IT); Maria Fortuna Bevilacqua, Gragnano (IT); Luigi Occhipinti, Ragusa (IT); Salvatore Coffa, Tremestieri Etneo (IT); Salvatore Castorina, Geneva (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 12/551,468

(22) Filed: Aug. 31, 2009

(65) Prior Publication Data

US 2009/0321619 A1   Dec. 31, 2009

Related U.S. Application Data

(62) Division of application No. 10/863,635, filed on Jun. 7, 2004, now Pat. No. 7,582,892.

(30) Foreign Application Priority Data

Jun. 6, 2003 (IT) .................................. TO03A0425

(51) Int. Cl.
    *H01L 31/00* (2006.01)
    *H01L 31/0232* (2006.01)
(52) U.S. Cl. ........................................ 257/428; 257/432
(58) Field of Classification Search .......... 257/428–448, 257/E31.003, E21.001
    See application file for complete search history.

(56) References Cited

U.S. PATENT DOCUMENTS

| 7,582,892 B2 | 9/2009 | Portico Ambrosio et al. |
| 2003/0098488 A1 | 5/2003 | O'Keeffe et al. |

OTHER PUBLICATIONS

Rueckes et al. (2000) "Carbon Nanotube-Based Nonvolatile Random Access Memory for Molecular Computing"; Science; 289(5476):94.
Cheng et al. (1998) "Large-Scale and Low-Cost Synthesis of Single-Walled Carbon Nanotubes by the Catalytic Pyrolysis of Hydrocarbons"; Appl. Phys. Lett.; 72:3282.
Martel et al. (1998) "Single- and Multi-Wall Carbon Nanotube Field-Effect Transistors"; Appl. Phys. Lett.; 73:2447.
Zhou et al. (2000) "Modulated Chemical Doping of Individual Carbon Nanotubes"; Science; 290:1552.

(Continued)

*Primary Examiner* — Cuong Q Nguyen
(74) *Attorney, Agent, or Firm* — Lisa K. Jorgenson; Kevin D. Jablonski; Graybeal Jackson LLP

(57) ABSTRACT

Described herein is an optically controlled electrical-switch device which includes a first current-conduction terminal and a second current-conduction terminal, and a carbon nanotube connected between the first and the second current-conduction terminals, the carbon nanotube being designed to be impinged upon by electromagnetic radiation and having an electrical conductivity that can be varied by varying the polarization of the electromagnetic radiation incident thereon. In particular, the carbon nanotube may for example, in given conditions of electrical biasing, present a high electrical conductivity when it is impinged upon by electromagnetic radiation having a given wavelength and a polarization substantially parallel to the axis of the carbon nanotube itself, and a reduced electrical conductivity when it is impinged upon by electromagnetic radiation having a given wavelength and a polarization substantially orthogonal to the axis of the carbon nanotube itself.

19 Claims, 7 Drawing Sheets

OTHER PUBLICATIONS

Bachtold et al. (2001) "Logic Circuits With Carbon Nanotube Transistors"; Science; 294:1317.

Zhang et al. (2001) "Electric-Field-Directed Growth of Aligned Single-Walled Carbon Nanotubes"; Appl. Phys. Lett.; 79:3155.

Steuerman et al. (2002) "Interactions Between Conjugated Polymers and Single-Walled Carbon Nanotubes"; J. Phys. Chem. B.; 106:3124.

Bozovic et al. (2000) "Optical Dichroism in Nanotubes"; Phys. Rev. B.; 62:6971.

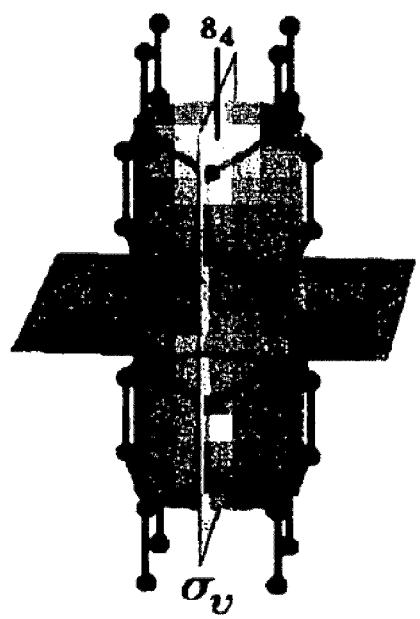 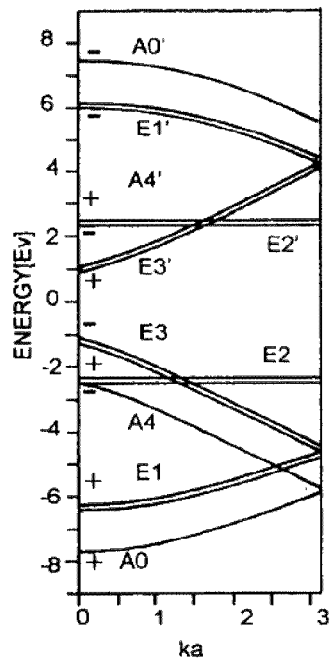 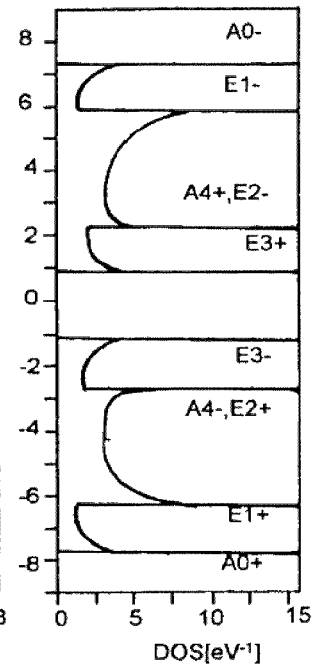
Fig.8a  Fig.8b  Fig.8c
| | POLARIZATION | |
|---|---|---|
| | ∥ | ⊥ |
| Δm | 0 | ± 1 |
| $\sigma_v$ | maintained | inverted |
| $\sigma_h$ | inverted | maintained |
| ALLOWED TRANSITION | A0+ →A0- , E1+ →E1-, E2+ →E2-, E3- →E3+, A4- →A4+ | E3- →E2-, E2+ →E3+ |
Fig.9

OPTICALLY CONTROLLED ELECTRICAL-SWITCH DEVICE BASED UPON CARBON NANOTUBES AND ELECTRICAL-SWITCH SYSTEM USING THE SWITCH DEVICE

PRIORITY CLAIM

The present application is a Divisional of copending U.S. patent application Ser. No. 10/863,635, filed Jun. 7, 2004; which claims the benefit of Italian Patent Application No. TO2003A000425, filed Jun. 6, 2004; all of the foregoing applications are incorporated herein by reference in their entireties.

BACKGROUND

Embodiments of the present invention relate to an optically controlled electrical-switch device based upon carbon nanotubes and to an electrical-switch system using the switch device.

In the last few years, the considerable success of CMOS technology has been determined fundamentally by the possibility of constantly reducing the dimensions of electronic devices. In fact, this technology follows the so-called Moore's law, according to which the number of transistors that can be obtained on an integrated circuit and, consequently, the speed of calculation should double in a time range of between 18 and 24 months.

However, it is a common conviction that conventional silicon micro-electronics cannot continue indefinitely to follow this law in so far as sooner or later physical limits that prevent current circuits from functioning in a reliable way at nanometric dimensions will certainly be reached, while at the same time an exponential increase in production costs will render any further increase in the levels of integration prohibitive. By increasing the density of the electronic devices on a chip, in fact, phenomena such as the need to dissipate the heat generated by such dense circuits and the transition from the classic behavior to the quantum behavior of charge carriers will considerably slow down progress.

In particular, thanks to the use of lithographic techniques, there have currently been reached dimensions of the order of 100 nm. Notwithstanding the rapid progress achieved in the current process of scale integration, current technology is difficult to scale further below these critical dimensions. In fact, once the critical dimensions have been reached, the small electrical currents that carry the information are transferred uncontrollably from one device to the other. In particular, when quantum effects start to become important, the transistors tend to lose the electrons that represent the information, so that it becomes difficult to maintain them in the original state. It is envisaged that, below the dimensions indicated of 100 nm, these difficulties are likely to become important.

The need to solve the above problems has forced research in the direction of the study of new technologies based upon the use of organic materials that can replace, altogether or in part, silicon in the construction of electronic devices.

Molecular electronics has the potentiality for overcoming the limits of silicon technology in so far as it is possible to fabricate single molecule devices that organize themselves in parallel by means of self-assembly techniques, which are also economically advantageous.

The need has thus arisen to explore the possibility of passing from current assembly technologies of the top-down type, whereby it is possible to reach the desired dimensions with successive removals of a macroscopic amount of a material, to technologies of the bottom-up type, whereby it is possible to make, and subsequently assemble, nanometric components starting from individual atoms or molecules, i.e., ones in which the devices involved in handling and retaining the data are molecules arranged and interconnected so as to form a circuit.

Amongst the different molecular structures studied, carbon nanotubes (CNTs) have aroused an enormous interest owing to their extraordinary physical properties. For a detailed treatment, see for example the article "Carbon Nanotube-Based Nonvolatile Random Access Memory for Molecular Computing", Science, Volume 289 (5476), Jul. 7, 2000, 94-97.

It is known the property of carbon atoms to organize themselves into different structures, giving rise to materials of different forms. In fact, diamond is made up of carbon atoms organized in tetrahedrons, while graphite is made up of carbon atoms organized in planar structures. These two allotropic forms, albeit arising from the same type of atoms, exhibit structural properties (hardness, elasticity, friction) and functional properties (electrical conductivity, color, etc.) that are very different and frequently opposite.

The structural characteristics, such as hardness and refractoriness, of graphite and diamond render it difficult to implement, at nanometric scales, an on-device approach of the top-down type. Instead, an approach of the bottom-up type is made possible by the use of another allotropic form of carbon, namely fullerene.

Belonging to the family of the fullerenes is $C_{60}$, also known as buckyball, which has a molecular structure having the shape of a polyhedral cage, made up of pentagons and hexagons. The structures of fullerenes, which develop in the form of long cylinders, rather than in the form of spheres, are called nanotubes. Their length (several microns) can be thousands of times larger than their diameter (just a few nanometers). Furthermore, using known techniques of molecular synthesis, there have been observed, in the laboratory, single-walled cylindrical structures, or single-walled nanotubes (SWNTs), having a diameter of 1-2 nm, and multiple-walled structures, or multiple-walled nanotubes (MWNTs), i.e., ones formed by coaxial cylinders, with diameters of some tens of nanometers.

Carbon nanotubes are organic molecules made up of a number of carbon atoms interconnected in a cylindrical structure, which are characterized by a low weight and have exceptional elastic properties that render them extremely hard but also capable of undergoing large deformations without breaking. Thanks to their exceptional mechanical properties and to their capacity of conducting electrical charges, carbon nanotubes, in so far as they can be configured both as conductors and as semiconductors, are suited for forming the components of a new class of nanometric electronic devices. In particular, they are believed to play a primary role in the development of molecular electronics on account of the fact that, thanks to their lateral dimensions of the order of the nanometer and their electrical conduction properties, they behave as quantum conductors of nanometric dimensions ("quantum nanowires").

Carbon nanotubes have different shapes that can be described by a vector, referred to as chiral vector C, as illustrated in FIG. 1.

In particular, in geometrical terms, a carbon nanotube can be obtained from a sheet of graphite, by "cutting" it along lines (dashed lines in FIG. 1) perpendicular to the chiral vector and by "rolling" it in the direction of the chiral vector itself. In this way, a cylinder of diameter $d=|C|/\pi$ is formed.

The chiral vector consequently defines the type of winding to which the individual sheet of graphite is subjected in order to give rise to a particular carbon nanotube. When the sheet of graphite is wound to form the cylindrical part of the carbon nanotube, the ends of the chiral vector are joined. The chiral vector hence represents a circumference of the circular section of the nanotube.

The chiral vector C can be set in relation to two unit vectors $a_1$ and $a_2$ that define the lattice of the planes in the graphite, by means of two indices n and m, according to the following equation:

$$C = n \cdot a_1 + m \cdot a_2$$

Linked to the indices n and m are an angle φ, referred to as chiral angle, and $$\phi = \arccos\left[\sqrt{3}\,(n+m)/2\sqrt{(n^2+m^2+nm)}\right]$$
$$d = \frac{a}{\pi}\sqrt{n^2+m^2+nm}$$

the diameter d of the carbon nanotube according to the following equations:

The values of the indices n and m define the chirality of the carbon nanotube, which is the state of the carbon nanotube itself, which differs according to the way in which the hexagons of the graphite arrange themselves in forming the cylindrical structure. The chirality of a carbon nanotube is thus given by the pair of integer indices (n, m) and determines the structural characteristics and, consequently, the electrical conduction properties of a carbon nanotube. In particular, in relation to the structure, nanotubes that have the indices n and m equal, i.e., nanotubes (n, n), are referred to as armchair nanotubes on account of the arrangement of the hexagons of graphite with respect to the axis of the carbon nanotube itself; nanotubes in which one of the two indices is zero (n, 0) are referred to as zigzag nanotubes; nanotubes for which the relation m=0 or else n=m is valid are referred to as achiral nanotubes; while nanotubes with different indices are in general referred to as chiral nanotubes.

The chirality conditions the conductance of the carbon nanotube, its density, its lattice structure, and other properties. The chiral indices can, in principle, be obtained experimentally, by measuring the chiral angle φ and the diameter d of the carbon nanotube with a transmission electron microscope (TEM) or with a scanning tunneling microscope (STM).

Furthermore, according to their chirality the nanotubes can be metallic nanotubes or semiconductor nanotubes. In fact, nanotubes whose chirality indices satisfy the following relation:

$$n - m = 3 \cdot I\quad I = 0, 1, 2,$$

are metallic and, hence, conductors; all the others have a nonzero bandgap and, consequently, behave as semiconductors. Armchair nanotubes are metallic.

The fundamental bandgap of a semiconductor carbon nanotube depends upon the diameter d of the carbon nanotube, on the basis of the following relation:

$$E_{gap} = 2 y_0 a_{cc}/d$$

where $y_0$ is the binding energy of the carbon atoms, and $a_{cc}$ is the distance between two neighboring carbon atoms.

Consequently, by appropriately modifying the chirality of the carbon nanotube and, hence, its diameter, it is possible to modulate its bandgap. The two different geometrical structures of the molecule (i.e., the initial one and the modified one) can thus represent two stable states.

Carbon nanotubes can be produced in macroscopic amounts using different techniques: laser ablation, arc discharge, or else chemical-vapor deposition (CVD). For a more detailed treatment as regards the latter technique see for example H. M. Cheng et al., Appl. Phys. Lett. 72, 3282 (1998).

In particular, the latter technique is compatible with the methods used in the micro-electronics industry and enables nanotubes to be grown on substrate. Using the various techniques, it has been found that the carbon nanotube that can be produced in the largest quantity is the carbon nanotube (10, 10).

As has been said, carbon nanotubes constitute a way for responding to the need to reduce the dimensions of devices in integrated circuits. In fact, by means of the versatile molecules, the path has been opened to the construction of molecular transistors.

In the last few years, different configurations of field-effect transistors have been proposed that use carbon nanotubes with semiconductor properties as channels for the transport of electrical charges. Some research groups (R. Martel et al. of the IBM Research Division, Chongwu Zhou et al. of the University of Southern California, etc.) have obtained a so-called "back-gate" configuration, illustrated, in schematic cross section, in FIG. 2, in which the substrate functions as gate of the device. The configuration renders, however, impossible the integration of a high number of devices on one and the same chip. In fact, in this case it would be necessary to apply the same gate voltage to all the transistors on the chip. For a more detailed treatment of the subject, see R. Martel, T. Schmidt, H. R. Shea, T. Hertel, and Ph. Avouris, *App. Phys. Lett.* 73, 2447 (1998) and C. Zhou, J. Kong, E. Yenilmez, H. Dai, *Science,* 290, 1552 (2000).

Subsequently, in 1998 researchers of the Dekker group of Delft University of Technology developed carbon-nanotube field-effect transistors (CNT-FETs) using an innovative configuration referred to as "local gate" configuration, illustrated in FIG. 3, which enables integration of a large number of devices on a single chip. For a more detailed treatment of the subject see A. Bachtold, P. Hadley, T. Nakanishi, C. Dekker, *Science,* 294, 1317(2001).

Broadly speaking, in the CNT-FETs the channel is constituted by a carbon nanotube functioning at room temperature, and the local gate is insulated from the carbon nanotube by means of an oxide layer of just a few nanometers in thickness. In particular, two gold electrodes were deposited, which function as source and drain, on a silicon oxide substrate grown on silicon, which functions as gate, and these two electrodes were connected with a single-walled nanotube (SWNT), which functions as channel. The current-voltage characteristic of this three-terminal device was measured and it was verified that it respected the characteristic of a field-effect transistor.

In particular, FIG. 3 illustrates a schematic cross section of the local-gate CNT-FET The gate in the device is constituted by an aluminium wire with an insulating layer of $Al_2O_3$, which separates it from the carbon nanotube. The semiconductor carbon nanotube is set in electrical contact with the two gold electrodes. The thickness of the $Al_2O_3$ layer (a few nanometers) is much smaller than the separation between the electrodes (~100 nm). This determines an excellent capacitive coupling between the gate and the carbon nanotube, the consequences of which result in a gain in voltage greater than 10 and in a wide range of the output signal. It is possible to design various aluminium local gates in such a way that each will address a different CNT-FET.

Formation of circuits comprising CNT-FETs is articulated in three fundamental steps. In the first step, the gate is obtained by delineating the aluminium pattern via electron-beam lithography (e-beam lithography) on an oxidized silicon wafer. The layer of insulating material is represented by an oxide grown by exposing the specimen to air. The thickness of the layer cannot be determined with great precision but is in the order of a few nanometers. The second step consists, instead, in dispersing single-walled nanotubes (SWNTs), previously produced by laser ablation, on the wafer starting from a suspension of dichloroethane. The nanotubes of appropriate diameter (~1 nm) are selected and positioned on the top part of the aluminium gate. An alternative technique envisages the growth in situ of the nanotubes using the chemical-vapor-deposition (CVD) technique assisted by orienting electrical fields (for a detailed treatment of the subject see Y. Zhang, A. Chang, J. Cao, Q. Wang, W. Kim, Y. Li, N. Morris, E. Yenilmez, J. Kong, H. Dai, *App. Phys. Lett.* 79, 3155 (2001)). Finally, the last step consists in the formation of electrodes and interconnections via electron-beam lithography, evaporating gold directly on the carbon nanotube without intermediate adhesion layers.

The CNT-FET illustrated in FIG. 3 is a p-type device functioning by enrichment since it is possible to obtain a marked modulation of the current through the FET by applying a small negative voltage to the gate. Furthermore, by acting on the gate voltage it is possible to vary the carrier concentration of the carbon nanotube, up to reversing its polarity from the p-type regime to the n-type regime.

FIG. 4 illustrates the current/source-drain voltage characteristics ($I/V_{sd}$) of the transistor measured at room temperature for different values of the gate voltage ($V_g$). As may be noted, the trend of the curves is typical of traditional FETs with finite values of the current, when the gate voltage is negative and smaller than the threshold voltage $V_t$ ($V_t \sim -1.0$ V).

The same research group mentioned above proposed, moreover, the possibility of making some elementary logic circuits based upon CNT-FETs. The applications (OR gates, AND gates, NOT gates, SRAMs) were obtained using the resistor-transistor logic scheme and forming the CNT-FETs on the same chip.

FIG. 5 gives the input-output transfer characteristics of a logic inverter with carbon-nanotube FETs and a pull-up resistor on the outside the chip with the value of 100 MΩ. The researchers identified the voltage of −1.5 V as an appropriate value for logic applications (logic 0=0 V, logic 1=−1.5 V).

When the input of the logic inverter assumes the logic value "1" ($V_{in}=-1.5$ V), the negative gate voltage induces a movement of electron holes in the carbon nanotube giving it a resistance that is considerably smaller than the pull-up resistance, and this pushes the output to the logic value "0" ($V_{out}=0$ V). When the input assumes instead the logic value "0" ($V_{in}=0$ V), the carbon nanotube is not conductive and the output assumes the logic value "1" ($V_{out}=-1.5$ V).

Recently, some studies have demonstrated the possibility of making molecular devices with non-electrical control using carbon nanotubes. In particular, an example of optically controlled molecular device based upon carbon nanotubes has been proposed by a research group of the University of California. For a detailed treatment of the subject see D. W. Steuerman, A. Star, R. Narizzano, H. Choi, R. S. Ries, C. Nicolini, J. F. Stoddart, J. R. Heath, *J. Phys. Chem.* B 106, 3124 (2002).

The above work investigated the interactions between single-walled carbon nanotubes (SWNTs) and two types of polymers:

PmPV (poly{(m-phenylene-vinylene)-co-[(2,5-dioctyloxy-p-phenylene)vinylene]}), and PPyPV (poly{(2,6-pyridinylene-vinylene)-co-[(2,5-dioctyloxy-p-phenylene)vinylene]}).

The two polymers indicated above are structurally similar and, in solution, are characterized by the same absorption spectrum with a peak in the proximity of 420 nm. The most significant difference is linked to the fact that the PPyPV is a base and, for this reason, is protonated by the HCl present in the solution in which the polymer is dissolved. The interaction with the carbon nanotubes favors the protonation process. The device obtained consists simply of two metal electrodes, between which are arranged the polymer/CNT blends (polymer-wrapped SWNTs), deposited by spin coating.

The above polymers and the carbon nanotubes are in electrical contact: in this way, it is possible to use radiation of appropriate wavelength for the purpose of modulating the electrical conductivity of the ropes of carbon nanotubes. The researchers carried out a series of measurements at different wavelengths for devices containing just ropes of CNTs, PmPV-wrapped/CNTs and PPyPV-wrapped/CNTs, and the current responses obtained are illustrated in FIGS. 6a, 6b, and 6c, respectively.

In particular, as emerges clearly from FIG. 6a, in the devices containing only CNTs no type of optically modulated response is detected. FIGS. 6b and 6c show, instead, the responses of the PmPV-wrapped/CNTs device with negative and positive electrical biasing, respectively. The variation of the output response is the same whatever the electrical biasing and is approximately 15-20% of the total current. In particular, there appears a photo-amplification of the current for positive biasing, i.e., the intensity of the total current in the device (dark current plus photogenerated current) increases, in absolute value, when the light at input is ON; on the other hand, for negative biasing there is a photorectification; consequently, in conditions of illumination the total current diminishes.

FIG. 7 illustrates, instead, the current response of a device with PPyPV-wrapped/CNTs. As may be noted, no effect is observed for negative biasing, while for positive biasing the effect of photo-amplification is substantially greater as compared to the previous case illustrated in FIGS. 6a, 6b, and 6c.

Using structures of this type, it is possible to make optically controlled electrical switches. In fact, as is evident from FIGS. 6b and 6c, to a switching of the optical signal at input (light ON-light OFF) there corresponds a switching of the electrical signal at output.

The fundamental limits of the above devices are linked basically to the complexity of their implementation in integrated technology on account of the technique used for depositing the polymer/CNT blend. The spin-coating technique, in fact, renders it extremely difficult to define on the chip delimited areas on which to deposit the solution. The delineation of these areas would require a further process of controlled removal of the "spin-coated" solution, to be appropriately defined on the basis of the properties of the starting solution. Furthermore, spin coating does not enable a good control of the uniformity of thickness of the deposited film to be obtained.

Another important embodiment is linked to the low temperatures at which the devices have been made and tested ($T_{op}=4$ K). From the literature, in fact, their behavior at room temperature is not known.

The purpose of embodiments of the present invention is to provide an optically controlled electrical-switch device that will enable the drawbacks of the known devices described above to be overcome at least in part.

SUMMARY

According to an embodiment of the invention an optically controlled electrical-switch device is provided.

According to an embodiment of the invention, there is provided an electrical-switch system.

According to an embodiment of the invention, there is further provided an optical-control method of an electrical switch device.

According to an embodiment of the invention, there is provided a fabrication process of an optically controlled electrical-switch device.

BRIEF DESCRIPTION OF THE DRAWINGS

For a better understanding of the present invention there is now described an embodiment, provided purely by way of non-limiting example and with reference to the annexed drawings, in which:

FIGS. 8a, 8b, and 8c show, respectively, the model of a single-walled carbon nanotube, namely, a zigzag (4,0) nanotube, the corresponding band structure, and the corresponding electron density of states;

FIG. 9 shows a table of the rules of selection for the absorption of the incident light upon a carbon nanotube;

Figure 1:
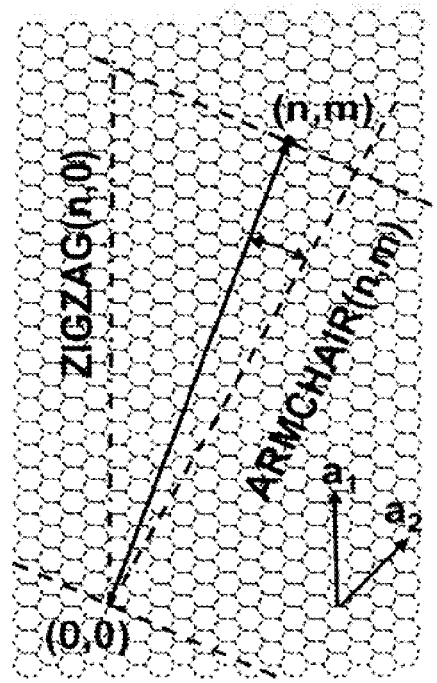
FIG. 1 shows the geometrical characterization of a carbon nanotube.
Figure 2:
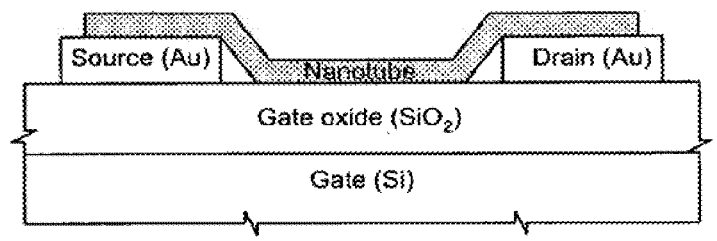
FIG. 2 shows a schematic cross section of a carbon-nanotube FET in the back-gate configuration.
Figure 3:
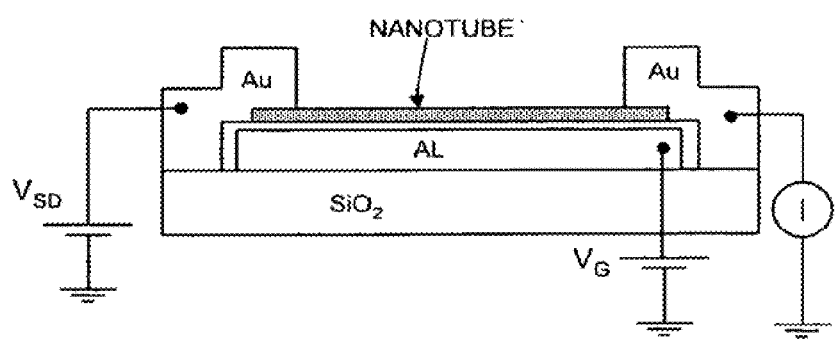
FIG. 3 shows a schematic cross section of a local-gate CNT-FET.
Figure 4:
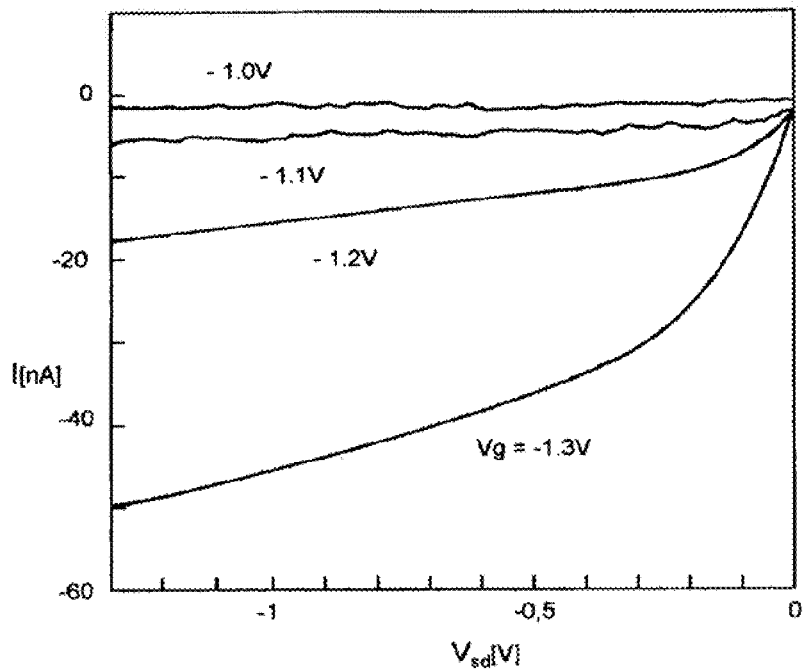
FIG. 4 shows voltage/current characteristics measured at room temperature for different gate-voltage values of a CNT-FET.
Figure 5:
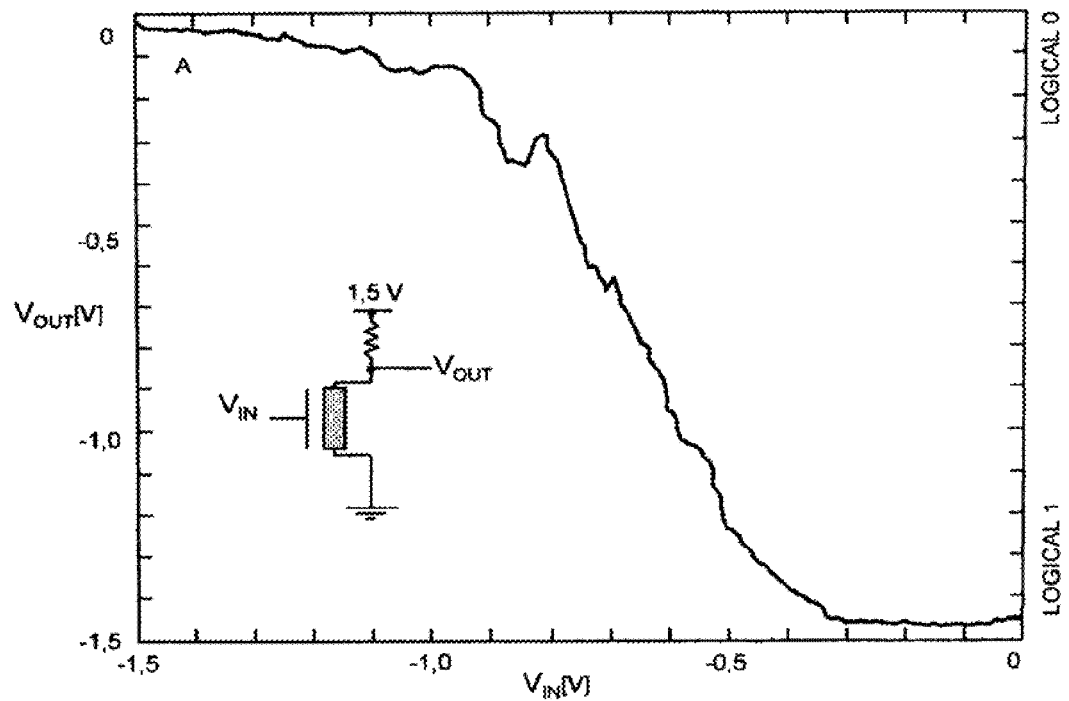
FIG. 5 shows the transfer characteristic of a logic inverter with CNT-FETs.
Figure 6A:
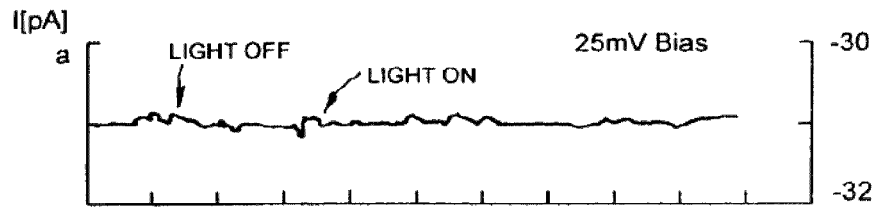
FIGS. 6a, 6b, and 6c show the current responses, respectively, of an optically controlled device obtained using CNTs, of an optically controlled device obtained with PmPV-wrapped/CNTs with negative electrical biasing, and of an optically controlled device obtained with PmPV-wrapped/CNTs with positive electrical biasing, in the presence and in the absence of incident light.
Figure 6B:
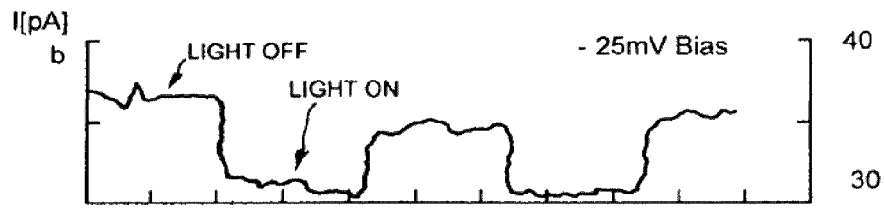
Figure 6C:
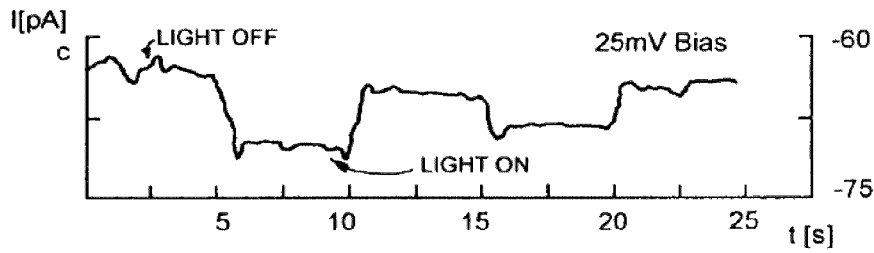
Figure 7:
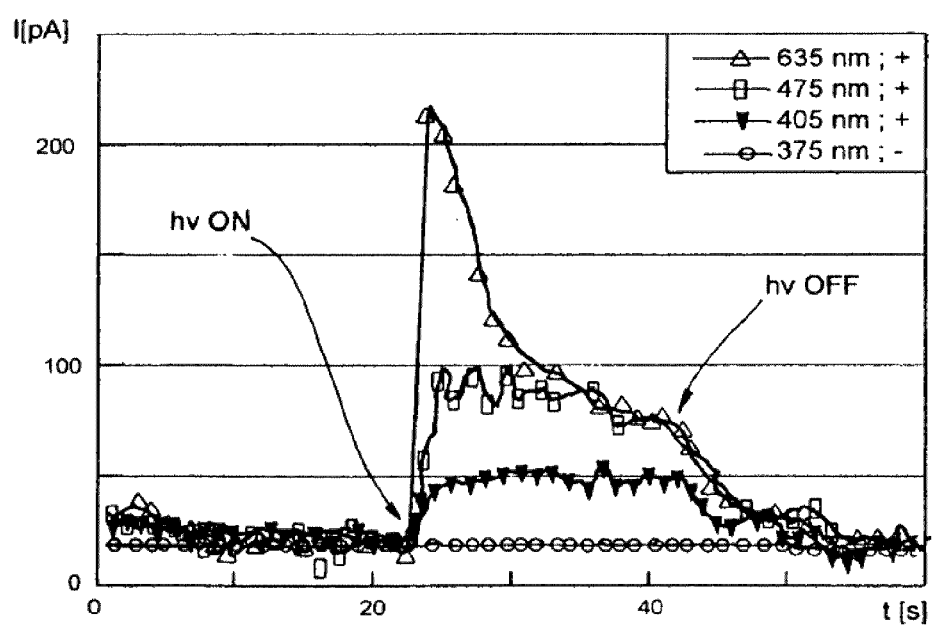
FIG. 7 shows the current response of an optically controlled device obtained with PPyPV-wrapped/CNTs in the presence and in the absence of incident light and as the wavelength of the incident light varies.

An innovative idea underlying embodiments of the present invention draws origins from different theoretical studies regarding the electronic and structural properties of carbon nanotubes that have highlighted how these molecular structures have the property of optical dichroism.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

In general terms, optical dichroism is the property of a means to absorb in a different way the two components of polarization of light that propagates in an anisotropic means. In particular, in an axisymmetrical means the two components of polarization of light referred to are the one parallel to and the one orthogonal to the optical axis.

In practice, a dichroic means behaves like a polarizing sheet: one direction of polarization is totally or partially transmitted, the one orthogonal thereto is absorbed.

The purpose of embodiments of the present invention is thus to exploit the property of optical dichroism of nanotubes in order to provide an electrical-switch device capable of switching between the two operating states, open and closed, by simply varying the polarization of the light incident upon the device itself.

The property of optical dichroism has been observed both in chiral nanotubes and in achiral nanotubes. Furthermore, different experimental studies have demonstrated that films of aligned nanotubes are birefringent on account of the difference in the dielectric functions for light polarized in a direction orthogonal to and a direction parallel to the axis of the nanotubes itself. In particular, a work has recently been published (I. Bozovic, N. Bozovic, M. Damnjanovic, *Phys. Rev. B* 62, 6971 (2000)) regarding the effect of optical dichroism in an individual carbon nanotube. The effect is linked to the specific rules of selection of the linear group for interband transitions. In Bozovic's work a single-walled carbon nanotube is considered, namely a zigzag (4, 0) nanotube with translational lattice pitch along the axis of the carbon nanotube a=4.26 Å. The spatial-symmetry group of the carbon nanotube is the linear group $L8_4$/mcm; this code is connected to the set of different symmetry properties of the carbon nanotube having a cylindrical geometry and refers to the symmetries of rotation about the vertical axis of the tube ($8_4$) and to the symmetries of reflection corresponding to the two planes ($\sigma_v$ and $\sigma_h$) that cross section the carbon nanotube, as indicated in FIG. 8a.

FIGS. 8a, 8b, and 8c illustrate, respectively, the model of the carbon nanotube, the corresponding band structure, and the corresponding electron density of states.

In particular, the symmetry groups of the system illustrated in FIG. 8a are represented by:

screw axis: rotation of $\alpha=2\pi/8$ about z followed by a translation of (a/2) along z;

plane of vertical reflection xz: $\sigma_v$;

plane of horizontal reflection xy: $\sigma_h$.

It is recalled that a symmetry group is constituted by the set of all the operations of symmetry of the cylindrical system with which a carbon nanotube can be geometrically schematized. The term "group" is used in a mathematical sense and indicates that all the operations of symmetry of the system are reunited so as to form a non-empty set that satisfies well-determined mathematical conditions, which represent the formal properties of a group (closure property, associative property, existence of the neutral element, existence of a single inverse element).

The electron density of states (DOS) of carbon nanotubes has a continuous energy-band structure, separated by energy gaps not accessible to electrons, the so-called bandgaps. The structure of these bands, their energy width, and the values of the gaps between the bands depend upon the characteristics of the carbon nanotube (single-wall or multi-wall, zigzag or armchair), and upon the indices n and m.

The band structure of the carbon nanotube is obtained using the "tight-binding" model (Neil W. Ashcroft, N. David Mermin, *Solid State Physics*, Philadelphia: Saunders College (1976)), through which the energy spectrum is obtained:

$$\varepsilon(m, k) = \pm \beta \sqrt{1 + 4\cos^2(m\alpha) + 4\cos(m\alpha)\cos\left(\frac{ka}{2}\right)}$$

The above expression shows the dependence of the energy upon the variables k and m and consequently indicates the possibility of reconstructing the entire band structure of the nanotube according to the value assumed by the variables k and m.

In the above expression:
m is the angular momentum which, in the case of the optical transitions for the system considered, can assume the values $0, \pm 1, \pm 2, \pm 3, 4$;
k is the quantum number indicating the quasimomentum along the z axis, connected to rules of crystalline symmetry of the structure considered;
a is the lattice pitch of the carbon nanotube;
$\alpha$ is the angle of rotation, corresponding to $2\pi/8$; and
$\beta$ is the energy associated to the term of overlapping of orbitals belonging to adjacent atoms; this term provides an indication of the overlap energy contribution linked to the distribution of the atoms arranged according to the crystallographic structure considered.

As highlighted in FIG. 8b, the valence and conduction bands are symmetrical with respect to the zero value of energy and are divided into non-degenerate bands, designated by A, and degenerate bands, designated by E. The degenerate energy bands are characterized by the fact that to each energy E(k) there corresponds more than one state.

Since the wavelength λ of visible light is large if compared to the lattice pitch a of the carbon nanotube, the conservation of linear momentum implies $\Delta k \approx 0$, where $\Delta k$ represents the difference between the values of the crystalline momentum k of the electron, before and after an interband transition; the crystalline momentum is introduced into the theory of solids, and to a first approximation can be identified with the linear momentum of the electron.

This means that the optical transitions allowed are basically vertical; by the term "optical transitions" is meant radiative electron transitions, i.e., ones with absorption (in excitations) or emission (in de-excitations) of radiation.

As regards the angular momentum of the electron involved in the transition, the rules of selection depend upon the orientation of the electrical field associated to the electromagnetic radiation incident upon the carbon nanotube. If the incident light is linearly polarized parallel to the axis of the carbon nanotube, then only the transitions between pairs of bands so that $\Delta m=0$ are allowed.

If the light is circularly polarized in the plane orthogonal to the axis of the carbon nanotube (i.e., the direction of propagation is parallel to the axis of the carbon nanotube), only transitions between bands such that $\Delta m = \pm 1$ can occur. The sign ± depends upon the phase difference (90° or else −90°) of the two components of the polarization vector.

The table of FIG. 9 presents, among other things, the transitions allowed corresponding to the different states of polarization of the incident light. The first column of table of FIG. 9 lists the parameters of polarization. The second column of the table list the parameters associated with linearly polarized light parallel to the axis of the carbon nanotube. The third column of the table lists the parameters associated with circularized polarized light orthogonal to the axis of the carbon nanotube.

For semiconductor carbon nanotubes like the one considered, if the energy of the photon is greater than the gap between bands, a significant photoconductivity due to a transition of electrons from the valence band to the conduction band is observed.

Figure 10:
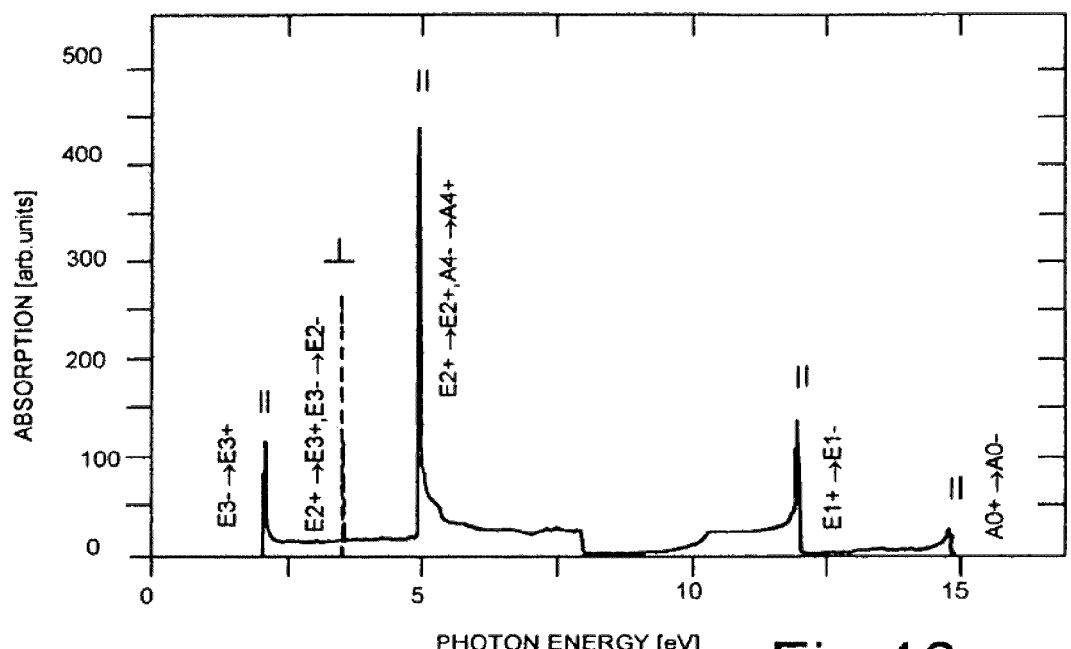
FIG. 10 shows the absorption spectrum of a carbon nanotube for light polarized in a direction parallel to and perpendicular to the axis of a carbon nanotube.

The optical absorption spectrum and, in particular, the position of the first intense peak of interband transition, is markedly dependent upon the polarization of the incident electromagnetic radiation, as highlighted in FIG. 10, which illustrates the absorption spectrum for electromagnetic radiation polarized in a direction parallel to and a direction perpendicular to the axis of a carbon nanotube of the type considered.

Consequently, by illuminating a semiconductor carbon nanotube with appropriate radiation, it is possible to induce interband transitions of electrons, via photon absorption, with consequent variation of the conductivity of the carbon nanotube itself.

In particular, a light is sent onto the carbon nanotube of a wavelength such that the corresponding energy of the photon may induce certain given electron transitions if the radiation is polarized in an appropriate direction with respect to the axis of the carbon nanotube, and may not induce transitions if it is, instead, polarized in a direction orthogonal to the previous one.

Figure 11:
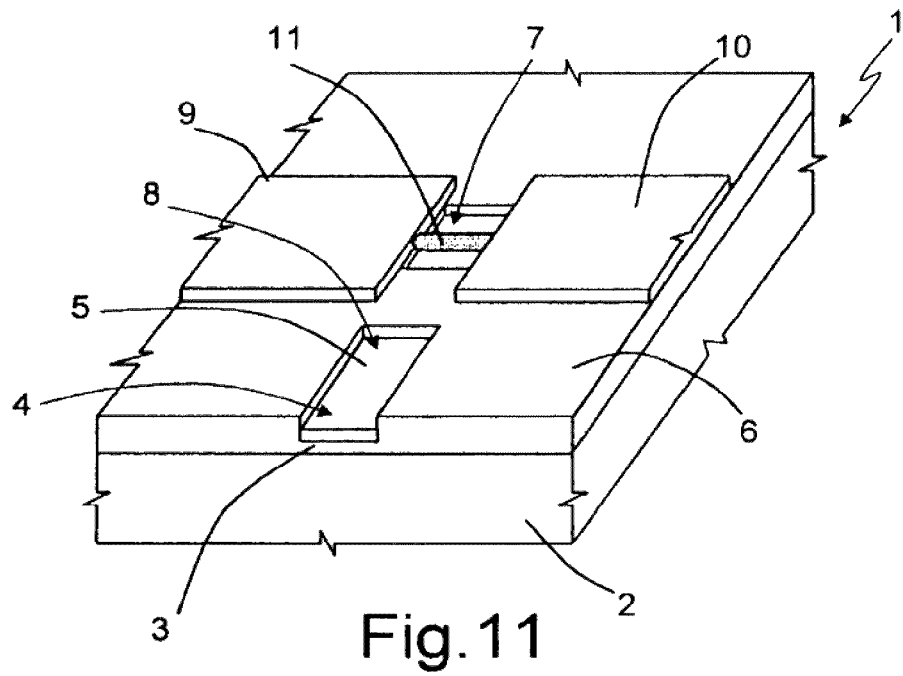
FIG. 11 shows a possible implementation on silicon of an optically controlled electrical-switch device according to an embodiment of the present invention.

FIG. 11 illustrates, by way of non-limiting example, a possible structure of an optically controlled electrical-switch device using a carbon nanotube according to an embodiment of the invention.

As may be noted, the switch device, designated as a whole by 1, can be obtained in a very simple way by depositing on a substrate 2 of monocrystalline silicon a thin layer of silicon oxide ($SiO_2$) 3 and then forming on the silicon-oxide layer 3 a planar waveguide 4, which can, for example, be obtained by simply depositing a thin strip of silicon nitride ($Si_3N_4$) 5 on the silicon-oxide layer 3.

The structure thus obtained is then coated with a second silicon-oxide layer 6, and a pair of windows 7, 8 is then opened in the second silicon-oxide layer 6 so as to expose two portions of the strip of silicon nitride 5 that function as input and output ends of the waveguide 4. In this configuration, the silicon oxide 3, 6 functions as cladding of the planar waveguide 4, while the silicon nitride 5 functions as core of the planar waveguide 4. The refraction indices of $SiO_2$ and $Si_3N_4$ are, respectively, 1.46 and 2.05, and these values of the refraction indices do not determine any restriction on the angle of acceptance of the waveguide 4, which is defined as the maximum angle whereby the external radiation can impinge upon the waveguide 4 so as to be conveyed within it.

On top of the second silicon-oxide layer 6, on opposite sides of one of the two windows opened in the second silicon-oxide layer 6 itself, in the example illustrated in FIG. 11 the window 7, two electrodes 9, 10 are obtained, for example made of gold, which function as contacts of the switch device 1. In a position facing the end of the waveguide 4 exposed through the window 7, there is then set a carbon nanotube 11, which is set in electrical contact with the two electrodes 9, 10.

By then sending, on the other end of the waveguide 4, exposed through the window 8, which is opened in the second oxide layer 6, electromagnetic radiation having a frequency and polarization, with respect to the axis of the carbon nanotube 11, such as to induce therein interband electron transitions, the electromagnetic radiation, after having traversed the stretch of waveguide 4 set below the second silicon-oxide layer 6, comes out of the end of the waveguide 4 facing the carbon nanotube 11 through the window 7, impinging upon the carbon nanotube 11.

The consequent photon absorption by the carbon nanotube 11 brings about an interband electron transition and a marked increase in the electrical conductivity of the carbon nanotube 11 itself; the electrical behavior of the switch device 1 may consequently be likened to that of a closed switch.

By sending, instead, on the first end of the waveguide 4 exposed through the window 8, electromagnetic radiation having polarization such as not to bring about any photon absorption by the carbon nanotube 11, no interband electron transition is brought about, and hence no increase in its electrical conductivity; the electrical behavior of the switch device 1 may consequently be likened to that of an open switch.

The solution proposed provides a number of degrees of freedom on which to act for the purposes of controlling the switch device. In fact, it is possible to act on the operating state of the switch device either by appropriately choosing the wavelength of the incident radiation, or else by regulating the electrical biasing of the switch device, i.e., the voltage applied to the carbon nanotube set between the electrodes.

In fact, for given wavelengths the radiation is absorbed only if it has a polarization parallel to the axis of the carbon nanotube; for other wavelengths, there will be absorption only for radiation polarized in a direction orthogonal to the axis; and, finally, for yet other wavelengths there will be no absorption in either of the two directions of polarization.

Furthermore, the absorption spectrum of the carbon nanotube, i.e., the position of the absorption peaks as a function of the wavelength changes if the electrical biasing of the carbon nanotube is modified, so that the electrical biasing may, for example, be fixed in such a way that the energy of the incident photons of a given wavelength (excitation energy) will, for example, be smaller than the bandgap energy for the perpendicular polarization of the incident radiation and greater than the corresponding bandgap energy for the parallel polarization of the incident radiation.

In this case, if radiation that is polarized in a direction parallel to the axis of the carbon nanotube impinges on the carbon nanotube, the energy associated to the photons is greater than the bandgap energy and the radiation is absorbed in so far as it is able to activate the interband transitions, while if the incident radiation is polarized in a direction perpendicular to the axis of the carbon nanotube, then the energy of the incident photons, since it is smaller than the bandgap energy, is not able to activate any type of transition; the effect of absorption, in this case, is extremely reduced. The measured photocurrent consequently varies drastically with the two different polarizations of the incident light.

In this case, a tunable light source is not necessary: the wavelength and the intensity of the light can be fixed while the electrical biasing of the carbon nanotube is modified.

The two states of polarization of the light incident upon the carbon nanotube, consequently, correspond to different values of absorption of light by the carbon nanotube itself and, hence, to two different states of conductivity of the carbon nanotube (high conductivity—HIGH state, low conductivity—LOW state). Once the electrical biasing of the switch device, the intensity of the incident light, and its wavelength (and hence the energy of the photons) are fixed, it is possible to control the switch device simply by rotating the polarization of the incident light.

Figure 12:
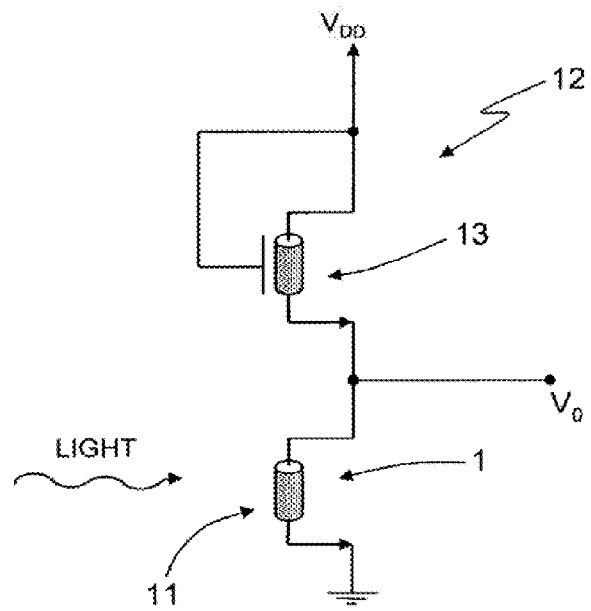
FIG. 12 shows the circuit diagram of a logic inverter with active load using an optically controlled electrical-switch device according to an embodiment of the invention.

FIG. 12 illustrates, by way of non-limiting example, one of the possible uses of the optically controlled electrical-switch device according to an embodiment of the invention. In particular, FIG. 12 illustrates the circuit diagram of a logic inverter with active load, designated as a whole by 12, in which the active load, designated by 13, is constituted by an electrically controlled pull-up transistor with its channel constituted by a carbon nanotube, while the pull-down transistor is constituted by the switch device 1 according to the embodiment of the invention previously discussed with reference to FIG. 11.

The embodiment of FIG. 12 may include an electrical-biasing device 14 for biasing the carbon nanotube 11, through which it is possible to vary the electrical biasing of the carbon nanotube 11 itself and, consequently, absorption of the light incident thereon.

The switching times of the logic inverter are linked to the electron transitions induced by the incident radiation. The absorption of radiation brings about transition of electrons to the conduction band, with creation of electron/hole pairs and consequent increase in the conductivity of the carbon nanotube (HIGH state), while, in the absence of absorption of radiation, there are no interband transitions (LOW state). Consequently, the switching times are correlated to the times of the electron transitions, which are in the order of 10 ns.

Figure 13:
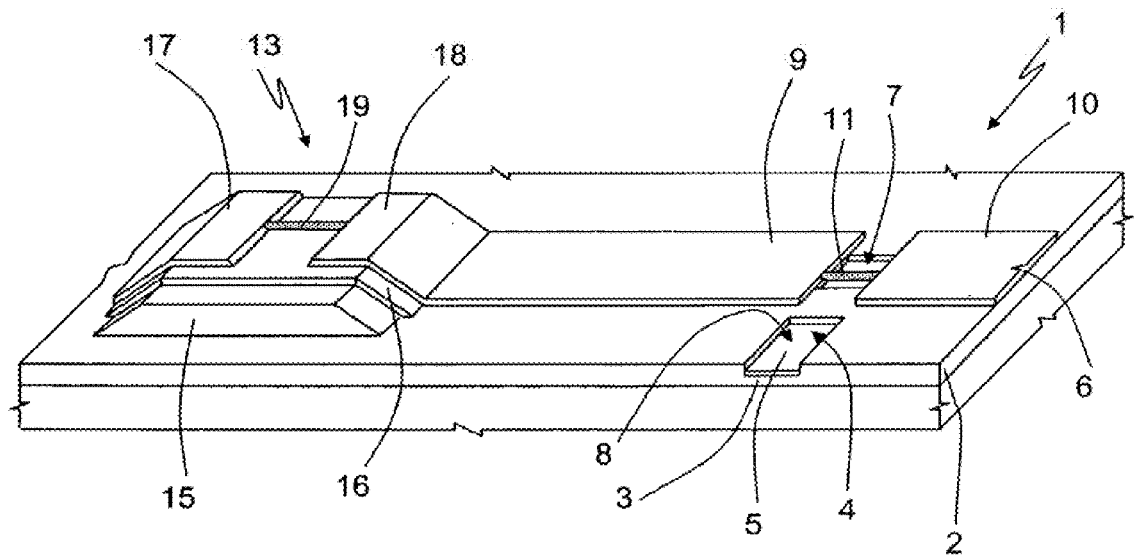
FIG. 13 shows a possible implementation on silicon of the logic inverter of FIG. 12.

FIG. 13 illustrates a possible implementation on silicon of the logic inverter of FIG. 12, in which parts that are the same as the ones of FIG. 11 are indicated with the same reference numbers.

In particular, as illustrated in FIG. 13, the pull-down transistor has a structure altogether identical to that of the switch device 1 illustrated in FIG. 11, in which the two electrodes 9, 10 now function as drain and source terminals of the pull-down transistor 1 itself. The electrically controlled pull-up transistor 13, which functions as active load and has its channel formed by a carbon nanotube, is obtained by depositing, on the second silicon-oxide layer 6, a layer of polycrystalline silicon 15, which has the function of gate terminal of the pull-up transistor 13, on which a further very thin layer 16 of silicon oxide is subsequently formed. Then, the drain and source terminals 17, 18, which are also made of gold, are obtained on the silicon-oxide layer 16 and between them a semiconductor carbon nanotube 19, which functions as channel, is then deposited, or grown, according to the used technique. In particular, the drain terminal 9 of the pull-down transistor 1 and the source terminal 18 of the pull-up transistor 13 are made integral with respect to one another, so as to define the output terminal of the inverter, while the gate terminal 15 of the pull-up transistor 13 is connected to the drain terminal 17 of the pull-up transistor 13 itself in a way known and not illustrated.

Figure 14:
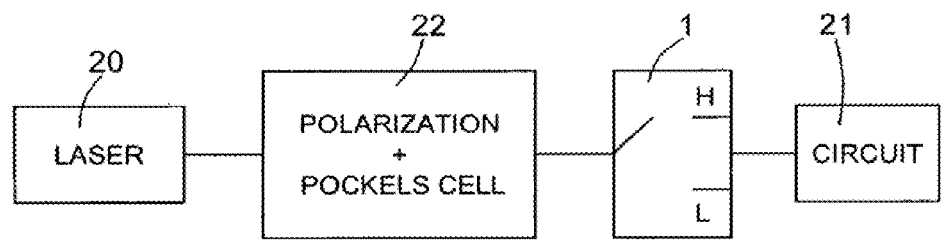
FIG. 14 shows a different possible use of an optically controlled electrical-switch device according to an embodiment of the invention.

FIG. 14 shows, by way of non-limiting example, a different possible use of the switch device 1 according to an embodiment of the invention. In particular, FIG. 14 illustrates a block diagram of a system for the activation of an electric circuit by means of an optical signal with control of polarization.

In detail, as illustrated in FIG. 14, an optical signal coming, for example, from a laser light source 20, is supplied at input to an electrical-switch device 1 according to embodiments of the invention, which issues a command for activation of a circuit 21 set downstream, according to the polarization of the optical signal supplied at input thereto.

Figure 15:
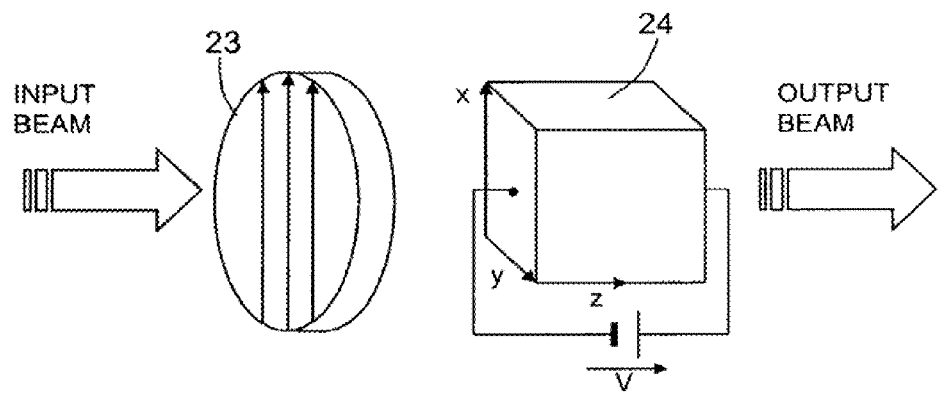
FIGS. 15 and 16 show the diagrams of two electro-optical switches, respectively, according to an embodiment of the present invention and according to the known art.

In particular, the polarization of the optical signal supplied by the laser light source 20 can be controlled by means of a control circuit 22 of the type illustrated in FIG. 15. This is made up of a light polarizer 23, which linearly polarizes the light coming from the laser light source 20, and by a Pockels cell 24, which is set downstream of the light polarizer 23 and is capable of rotating the direction of polarization of the light coming out of the light polarizer 23, via application of an appropriate external voltage V, by causing it to vary between the two states parallel and perpendicular to the axis of the carbon nanotube of the electrical switch 1 according to an embodiment of the invention.

As is known, a Pockels cell is a cell that exploits the so-called Pockels effect and is basically formed by an appropriate crystal, to which, by applying a potential difference, a variation of the index of refraction along an axis is induced. This, in turn, induces a birefringence effect proportional to the applied voltage, thus creating a system capable of varying the plane of polarization of the light.

From an examination of the characteristics of the optically controlled electrical-switch device obtained according to embodiments of the present invention, the advantages that it makes possible are evident.

In particular, by exploiting the property of optical dichroism of carbon nanotubes, the present invention makes available an electro-optical switch device of nanometric dimensions which is driven by acting, rather than upon the presence/absence of light, as occurs in electro-optical switch devices according to the known art, but upon the polarization of the electromagnetic radiation at input.

Figure 16:
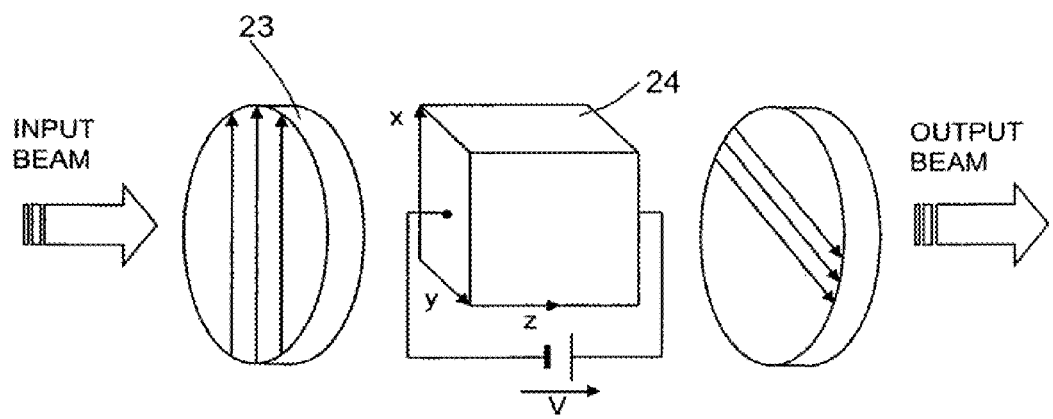

Furthermore, embodiments of the present invention enable an electro-optical switch to be obtained having a structure simpler than that of electro-optical switch devices according to the known art. This function, in fact, is usually obtained using the diagram illustrated in FIG. 16, i.e., arranging in cascaded fashion: a first light polarizer for linearly polarizing the input light in a given direction; a Pockels cell, for rotating the direction of polarization of the light coming out of the light polarizer via the application of an appropriate external voltage; and a second light polarizer for linearly polarizing the light coming out of the Pockels cell in a direction perpendicular to that of the first polarizer. By acting appropriately upon the voltage applied to the Pockels cell, it is possible to cause the electromagnetic radiation to come out or otherwise from the second polarizer. By detecting the presence or absence of the electromagnetic radiation at output from the second polarizer, for example via an appropriate optical detector circuit, it is possible to control activation or deactivation of a circuit set downstream of the electro-optical switch device.

Using, instead, the switch device according to embodiments of the invention, it is possible to do without the second polarizer, and this possibility becomes particularly important for construction of nanometric electro-optical devices, in so far as the absence of a second polarizer reduces the overall dimensions considerably.

Finally, it is clear that modifications and variations may be made to the optically controlled electrical-switch device described and illustrated herein, without thereby departing from the scope of the present invention, as defined in the appended claims.

The described embodiments of switch device 1 and systems including the switch device may be utilized in a variety of different types of electronic systems, such as computer systems and memory systems.

The invention claimed is:

1. An electrical-switch system, comprising:
   an optically controlled electrical-switch device comprising,
      a first current-conduction terminal,
      a second current-conduction terminal, and
      at least one carbon nanotube connected between the first and second current-conduction terminals;
   an electromagnetic radiation generating device for generating and directing electromagnetic radiations onto each carbon nanotube; and
   a polarization varying device for varying a polarization of the electromagnetic radiation emitted by the electromagnetic radiation generating device to control the electrical conductivity of each carbon nanotube.

2. The electrical-switch system according to claim 1, wherein the polarization varying device varies the polarization of said electromagnetic radiation in response to a control signal of an electrical type.

3. The electrical-switch system according to claim 2, wherein the polarization varying device supplies at an output electromagnetic radiation having a first polarization with respect to the axis of each nanotube to which there corresponds, in a given condition of electrical biasing of the carbon nanotube and for a given wavelength of the incident electromagnetic radiation, a high electrical conductivity of the carbon nanotube, and a second polarization with respect to the axis of each nanotube, substantially orthogonal to the first polarization, to which there corresponds a reduced electrical conductivity of the carbon nanotube.

4. The electrical-switch system according to claim 1, wherein the polarization varying device comprises a polarizer and a Pockels cell arranged in cascaded fashion.

5. The electrical-switch system according to claim 1, further comprising an electrical-biasing device for biasing each carbon nanotube, designed to vary each nanotube's conditions of absorption of the incident electromagnetic radiation.

6. A switch device, comprising:
   first and second terminals:
   a nanotube structured between the first and second terminals, the nanotube being operable as a function of a polarization of electromagnetic radiation incident upon the nanotube to control a current flowing through the nanotube; and
   a waveguide structured to receive electromagnetic radiation having a given polarization and to guide this electromagnetic radiation to the nanotube to thereby control current through the nanotube as a function of the polarization of the electromagnetic radiation.

7. The switch device of claim 6 wherein the electromagnetic radiation has a first polarization that corresponds to a first logical state in the switch device.

8. The switch device of claim 7 wherein the electromagnetic radiation has a second polarization that corresponds to a second logical state in the switch device.

9. The switch device of claim 8 wherein the first polarization is orthogonal to the second polarization.

10. The switch device of claim 6 further including an electrical bias circuit that applies a bias voltage to the first and second terminals, the bias voltage operable to adjust a wavelength of electromagnetic radiation that is absorbed by the nanotube.

11. The switch device of claim 10 wherein for a given value of the bias voltage the nanotube is operable to present a high conductivity state for electromagnetic radiation having a first polarization and a low conductivity state for electromagnetic radiation having a second polarization that is orthogonal to the first polarization.

12. The switch device of claim 6 further comprising a load element coupled to one of the first and second terminals to thereby form a logic inverter circuit.

13. An electronic circuit, comprising:
- an optical generation circuit operable to generate an optical signal;
- a polarization circuit positioned adjacent the optical generation circuit and operable to polarize the optical signal to generate a polarized optical signal; and
- a switch device positioned adjacent the polarization circuit to receive the polarized optical signal, the switch device including,
    - first terminal and second terminals; and
    - a nanotube structured between the first and second terminals, the nanotube being operable as a function of the polarization of the polarized optical signal to control a current flowing through the nanotube between the first and second terminals.

14. The electronic circuit of claim 13 wherein the optical generation circuit comprises a laser.

15. The electronic circuit of claim 13 wherein the polarization circuit comprises:
- a light polarizer adapted to receive incident light; and
- a Pockels cell positioned adjacent the polarizer to receive polarized light from the polarizer.

16. An electronic system, comprising:
- a switch device including,
    - first terminal and second terminals;
    - a nanotube structured between the first and second terminals, the nanotube being operable as a function of a polarization of electromagnetic radiation to which the nanotube is exposed to control a current flowing through the nanotube;
    - a waveguide structured to receive electromagnetic radiation having a polarization and to guide this electromagnetic radiation to the nanotube; and
- electronic circuitry coupled to the waveguide, the electronic circuitry operable to provide electromagnetic radiation to the waveguide and to control the polarization of this electromagnetic radiation.

17. The electronic system of claim 16 wherein the electronic circuitry comprises computer circuitry.

18. The electronic system of claim 16 further comprising additional electronic circuitry coupled to the switch device and operable to sense a current flowing through the nanotube.

19. The electronic system of claim 16 wherein the electronic circuitry provides electromagnetic radiation to the waveguide having either a first polarization or a second polarization.

* * * * *